(12) United States Patent
Imai et al.

(10) Patent No.: US 6,922,105 B2
(45) Date of Patent: Jul. 26, 2005

(54) OPERATIONAL AMPLIFIER

(75) Inventors: Hiroshi Imai, Kariya (JP); Mitsuru Aoki, Aichi-ken (JP); Hiroyuki Ban, Aichi-ken (JP)

(73) Assignee: Denso Corporation, Kariya (JP)

(*) Notice: Subject to any disclaimer, the term of this patent is extended or adjusted under 35 U.S.C. 154(b) by 0 days.

(21) Appl. No.: 10/632,849

(22) Filed: Aug. 4, 2003

(65) Prior Publication Data

US 2004/0021520 A1 Feb. 5, 2004

(30) Foreign Application Priority Data

Aug. 5, 2002 (JP) ...................................... 2002-227444

(51) Int. Cl.[7] .............................................. H03F 3/26
(52) U.S. Cl. ...................... 330/255; 330/264; 330/267
(58) Field of Search ................................ 330/252, 253, 330/255, 264, 267

(56) References Cited

U.S. PATENT DOCUMENTS

| 5,905,617 | A | 5/1999 | Kawasoe | 361/86 |
|---|---|---|---|---|
| 6,232,824 | B1 | 5/2001 | Kono | 327/530 |
| 6,566,957 | B1 * | 5/2003 | Caine | 330/296 |

FOREIGN PATENT DOCUMENTS

| JP | 49-63366 | 6/1974 |
|---|---|---|
| JP | 55-154809 | 12/1980 |
| JP | 5-259544 | 10/1993 |
| JP | 7-227035 | 8/1995 |
| JP | 8-307224 | 11/1996 |
| JP | 9-8562 | 1/1997 |
| JP | 11-46120 | 2/1999 |
| JP | 2001-35160 | 2/2001 |

* cited by examiner

*Primary Examiner*—Steven J. Mottola
(74) *Attorney, Agent, or Firm*—Posz Law Group, PLC

(57) ABSTRACT

In an operational amplifier, a differential amplifying circuit is configured to amplify an input voltage inputted from the input terminal. An outputting transistor is connected to the output terminal. A driving transistor is connected to the differential amplifying circuit and the outputting transistor. The driving transistor turns on according to a control signal supplied from the differential amplifying circuit to the driving circuit. The driving transistor is also configured to drive the outputting transistor according to the control signal. A control signal reducing circuit, when a voltage is applied on the driving transistor through the outputting transistor, is configured to reduce the control signal within a range that the driving transistor is kept to on state. The voltage applied on the driving transistor exceeds a predetermined threshold voltage.

8 Claims, 4 Drawing Sheets

OPERATIONAL AMPLIFIER

BACKGROUND OF THE INVENTION

The present invention relates to an operational amplifier having a function for protecting a short-circuit of the output terminal.

An ECU (Electrical Control Unit) is installed in a vehicle and electrically connected to loads provided in various portions of the vehicle and to other ECUs provided in the vehicle by means of harnesses.

A conventional connection topology of a vehicle uses the body as ground so that signal harnesses including driving harnesses are often independently wired so that, short-circuit failures, as failures in the course of wiring the vehicle, mainly occur between the signal harnesses and the body.

In order to avoid the short-circuit failures, an operational amplifier used in the output unit of the ECU additionally includes a protecting circuit for protecting the short-circuit failure between the output terminal of the output unit and the ground.

FIG. 3 shows an electrical structure of a driving unit and an output unit of a conventional operational amplifier. In FIG. 3, a transistor Q1 and Q2, which constitute a push-pull output circuit 3, are connected in series through an output terminal 4 between the power and ground lines 1 and 2. A resistor R1 is connected between the transistor Q1 and the output terminal 4. Transistors Q3 to Q6 constitute a driving circuit 5 for driving the transistors Q1 and Q2. A transistor Q7 and the resistor R1 are served as a protecting circuit 6. That is, the transistor Q7 turns on when the output terminal 4 is short-circuited to the ground line 2, causing the transistor Q1 to turn off.

By the way, each of recent vehicles comprises many ECUs to obtain multifunction so that the harnesses installed in the vehicle for connecting the many ECUs are increased, thereby causing the weight of the harnesses to be increased.

In order to decrease the number of harnesses, some of the vehicles may have the connection topology of the power harness in that the single power harness from the battery is bundled together with the signal harnesses and the single power harness and the single harness is sequentially cascade-connected to each of the ECUs in place of the connection topology in that power harnesses from the battery are parallelly connected to the ECUs, respectively.

In addition, in order to prevent foreign noises from entering into the harnesses, in many cases, the signal harnesses, the power harnesses and the ground harnesses are wired together, which is served as a guard ring. This connection topology, however, causes the signal harnesses and the power harnesses to be short-circuited, in addition to the short-circuit failures of the signal harnesses and the body of the vehicle.

The operational amplifier shown in FIG. 3, even if the output terminal 4 is short-circuited to the power harness that has the same potential as the power line 1, is not immediately broken down. If the short-circuit state is kept, however, the operational amplifier may cause thermal breakdown.

In order to counter the problem, providing the protecting circuit which is the same as the protecting circuit 6 in the operational amplifier in FIG. 3 for making turn off the transistor Q2 is considered.

The structure, however, the register inserted between the output terminal 4 and the transistor Q2 makes increase the minimum voltage that the operational amplifier can output, whereby the operational amplifier having the structure may not be used in cases where loads that do not correspond to the voltage region that the operational amplifier can output.

Then, in order to count the problem, conventional amplifiers need to comprise another protecting circuit for detecting the occurrence of the short-circuit failure to electrically disconnect the output terminal, or to make large each size of each element (component) of the operational amplifier to increase the capability of each element of resisting the thermal breakdown, causing the whole circuit size of the operational amplifier to increase and the cost thereof to increase.

SUMMARY OF THE INVENTION

The present invention is made on the background.

Accordingly, it is an object of the present invention to provide an operational amplifier having a function for protecting it from the short-circuit between the output terminal and the power line without narrowing the voltage range that the operational amplifier can output and complicating the circuit structure of the operational amplifier.

According to one aspect of the present invention, there is provided an operational amplifier with an input terminal and an output terminal, the operational amplifier comprising: a differential amplifying circuit configured to amplify an input voltage inputted from the input terminal; an outputting transistor connected to the output terminal; a driving transistor connected to the differential amplifying circuit and the outputting transistor, the driving transistor turning on according to a control signal and configured to drive the outputting transistor according to the control signal, the control signal being supplied from the differential amplifying circuit to the driving circuit; and a control signal reducing circuit, when a voltage is applied on the driving transistor through the outputting transistor, configured to reduce the control signal within a range that the driving transistor is kept to on state, the voltage applied on the driving transistor exceeding a predetermined threshold voltage.

BRIEF DESCRIPTION OF THE DRAWINGS

Other objects and aspects of the invention will become apparent from the following description of embodiments with reference to the accompanying drawings in which.

DETAILED DESCRIPTION OF EMBODIMENTS OF THE INVENTION

An embodiment of the invention will be described hereinafter with reference to the accompanying drawings.

Figure 1:
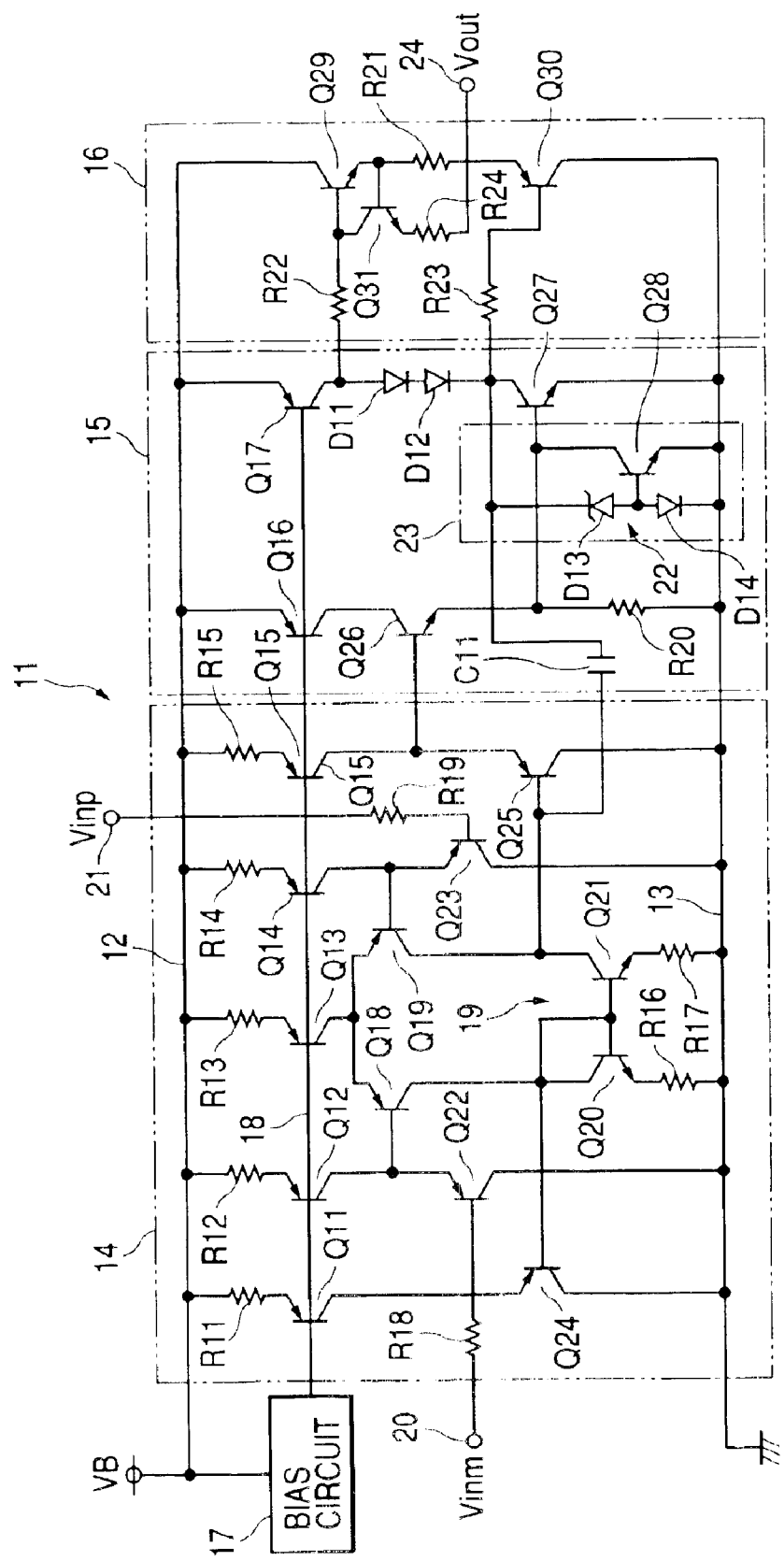
FIG. 1 is an electrical diagram of an operational amplifier that is utilized in a signal output unit of an ECU for vehicles according to an embodiment of the invention.

FIG. 1 illustrates an electrical diagram of an operational amplifier 1 that is utilized in a signal output unit of an ECU for vehicles.

As shown in FIG. 1, the operational amplifier 11 is composed of a part of a control IC (Integration Circuit) mounted on a substrate of the ECU. The operational amplifier 11 is configured to operate on the basis of a battery voltage VB supplied between power lines 12 and 13 through an ignition switch (not shown) from a battery (not shown).

In this embodiment, the power line 12 is set to the battery potential (battery voltage VB), and the power line 13 is set to the ground potential (ground voltage) and connected to, for example a body of the vehicle. The power line 13 is referred to as "ground line 13" in this embodiment.

That is, the operational amplifier 11 comprises a differential amplifying circuit 14, a driving unit 15, an output unit 15 and a bias circuit 17. The differential amplifying circuit 14 comprises PNP bipolar transistors (PNP transistors) Q11 to Q15 and the driving unit 15 comprises PNP transistors Q16 and Q17. Each base of the transistors Q11–Q17 is common.

The bias circuit 17 is connected to the common base (base line) of each of the transistors Q11 to Q17 and configured to output a bias voltage to the common base line of each of the transistors Q11 to Q17, thereby making the transistors Q11 to Q17 constant current operations, respectively.

The differential amplifying circuit 14 comprises resistors R11 to R15 that are connected between the power line 12 and the emitters of the transistors Q11 to Q15, respectively.

The differential amplifying circuit 14 also comprises a pair of PNP transistors Q18 and Q19 connected to the collector of the transistor Q13. The differential amplifying circuit 14 comprises an NPN bipolar transistor (NPN transistor) Q20 and a resistor R16 that are connected between the collector of the transistor Q18 and the ground line 13 and that are served as a positive load 19. That is, the collector of the transistor Q18 is connected to the collector of the transistor Q20 and the resistor R16 is connected between the emitter of the transistor Q20 and the ground line 13.

Similarly, the differential amplifying circuit 14 comprises an NPN transistor Q21 and a resistor R17 that are connected between the collector of the transistor Q19 and the ground line 13 and that are served as positive node 19. That is, the collector of the transistor Q19 is connected to the collector of the transistor Q21 and the resistor R17 is connected between the emitter of the transistor Q21 and the ground line 13. The base and the collector of the transistor Q20 are short-circuited to each other.

In addition, the differential amplifying circuit further comprises PNP transistors Q22 and Q23 each of which has a level shift circuit. The transistor Q22 and Q23 are connected between the ground line 13 and the collectors of the transistors Q12 and Q14, respectively. The emitters of the transistors Q22 and Q23 are connected to the bases of the transistors Q12 and Q13, respectively. The base of the transistor Q22 is connected through a resistor R18 to a reverse input terminal 20 of the operational amplifier 11, and the base of the transistor Q23 is connected through a resistor R19 to a non-reverse input terminal 21 of the operational amplifier 11.

The transistors Q22 and Q23 allow input bias current to decrease and the lowest voltages of the input voltages Vinm and Vinp to decrease up to the vicinity of 0 V.

The differential amplifying circuit 14 comprises PNP transistors Q24 and Q25 that are connected between the ground line 13 and the collectors of the transistors Q11 and the Q15, respectively. The bases of the transistors Q24 and Q25 are connected to the collectors of the transistors Q20 and Q21, respectively. The bases of the transistors Q24 and Q25 are also connected to the collectors of the transistors Q18 and Q19. These transistors Q24 and Q25 constitute, in place of the transistors Q18 and Q19, a base current compensating circuit for supplying the base current to each of the transistors Q20 and Q21.

The driving circuit 15 is a circuit for driving the output unit 16 in accordance with a control signal outputted from the differential amplifying circuit 14.

That is, the driving circuit 15 comprises an NPN transistor Q26 and a resistor R20 that are connected between the collector of the transistor Q16 and the ground line 13 in series. The base of the transistor Q26 is connected to the emitter of the transistor Q25, which is an output node of the differential amplifying circuit 14.

On the other hand, the driving circuit 15 also comprises diodes D11, D12 and an NPN transistor (a driving transistor) Q27 that are connected between the collector of the transistor Q17 and the ground line 13 in series. The base of the transistor Q27 is connected to the emitter of the transistor Q26.

The driving circuit 15 further comprises a voltage detecting circuit 22 connected between the corrector of the transistor Q27 and the emitter (the ground line 13) thereof. The voltage detecting circuit 22 comprises a Zener diode D13 having the polarity shown in FIG. 1 and a diode D14 that are connected to each other in series.

The cathode of the Zener diode D13 is connected to the collector of the transistor Q27, and that of the diode D14 is connected to the emitter of the transistor Q27.

The driving circuit 15 comprises a transistor Q28 served as a control signal regulating circuit whose collector is connected to the base of the transistor Q27, which is served as a control terminal thereof. The emitter of the transistor Q28 is connected to the emitter of the transistor Q27, which is served as a control terminal thereof. The base of the transistor Q28 is connected to a common connection point of the anodes of the Zener diode D13 and diode D14. These voltage detecting circuit 22 and the transistor Q28 constitute a control signal reducing circuit 23. Incidentally, a resistor may be used in place of the diode D14.

The driving circuit 15 also comprises a capacitor C11 connected between the collectors of the transistors Q27 and Q21.

The output unit 16 has a push-pull circuit configuration. That is, the output unit 16 comprises an NPN transistor Q29 and a resistor R21 that are connected in series between the power line 12 and the output terminal 24 of the output unit 16.

The output unit 16 also comprises a PNP transistor (an outputting transistor) Q30 connected between the output terminal 24 and the ground line 13. The bases of the transistors Q29 and Q30 are connected to the collectors of the transistors Q17 and Q27 through resistors R22 and R23, respectively. The resistor R23 corresponds to a current regulating circuit in this embodiment.

The output unit 16 also comprises an NPN transistor Q31 for overcurrent protection whose collector and base are connected to the base and the emitter of the transistor Q29, respectively. The emitter of the transistor Q31 is connected through a resistor R24 to the output terminal 24.

Next, operations of the operational amplifier 11 having negative feedback configuration so that the output signal from the output terminal 24 is applied back to one of the input terminals 20 and 21 will be described hereinafter.

In the above configuration of the operational amplifier 11, when a signal harness connected to the output terminal 24 of the operational amplifier 11 at an exterior of the control IC is not short-circuited to a power harness having the same potential (voltage) of the power line 12 and a ground harness having the same potential (voltage) of the ground line 13, in other words, the operational amplifier 11 is normal, the output voltage Vout outputted from the output terminal 24 is reduced from the battery voltage VB by the collector-emitter voltage of the transistor Q29 and the voltage between both ends of the resistor R21.

The output voltage Vout is applied on the collector-emitter of the transistor Q27 and on the voltage detecting circuit 22, respectively.

The applied voltage is lower than the voltage Vr obtained by adding the Zener voltage Vz of the Zener diode D13 and the base-emitter voltage VBE required for turning on the transistor Q28, voltage Vr which corresponds to a predetermined threshold voltage) so that all of the Zener diode D13, the diode D14 and the transistor Q28 are off-states. In addition, the voltage between both ends of the resistor R21 is lower than the base-emitter voltage VBE required for turning on the transistor Q31 so that the transistor Q31 is also off-state.

The differential amplifying circuit 14 amplifies the difference voltage between the input voltage Vinp and the input voltage Vinm to output the amplified voltage to the base of the transistor Q26 of the driving unit 15. The transistor Q26 outputs the base current, which corresponds to "control signal" in accordance with the amplified voltage to the transistor Q27 so that the transistor Q27 turns on so that the transistor Q17 and the transistor Q27 cause the push-pull circuit (the transistors Q29 and Q30) to perform the push-pull operation.

In contrast, if the signal harness connected to the output terminal 24 is short-circuited to the ground harness, or if the load resistor connected between the output terminal 24 and the ground (the negative terminal of the battery) is low, the voltage between the both ends of the resistor R21 is higher than the base-emitter voltage VBE of the transistor Q31 required for turning on the transistor Q31 so that the transistor Q31 turns on, causing the base potential (voltage) of the transistor Q29 to be low. The low of the base potential of the transistor Q29 regulates the output current through the transistor Q29, making it possible to protect the operational amplifier 11 from the short-circuit of the output terminal 24.

On the other hand, if the signal harness connected to the output terminal 24 is short-circuited to the power harness having the battery potential (battery voltage VB), or if the load resistor connected between the output terminal 24 and the power supply (the positive terminal of the battery) is low, the voltage Vout of the output terminal 24 rises up to the vicinity of the battery voltage VB so that the voltage applied on the collector-emitter of the transistor Q27 and the voltage detecting circuit 22 rises through the base-emitter of the transistor Q30 and the resistor R23.

The voltage applied on the collector-emitter of the transistor Q27 and the voltage detecting circuit 22 is higher than the voltage Vr so that the Zener diode Vz turns on, causing the base current to flow in the transistor Q28. The base current turns on the transistor Q28 so that a part of the base current outputted from the transistor Q26 to the transistor Q27 is caused to flow through the transistor Q28 to the ground line 13. As a result, the base current of the transistor Q27 is reduced so that the collector potential (voltage) of the transistor Q27, in other words, the base potential of the transistor Q30 rises, regulating the output current Iout through the transistor Q30. The regulation of the output current Iout allows the operational amplifier 11 to be protected from the short-circuit of the output terminal 24.

Figure 2A:
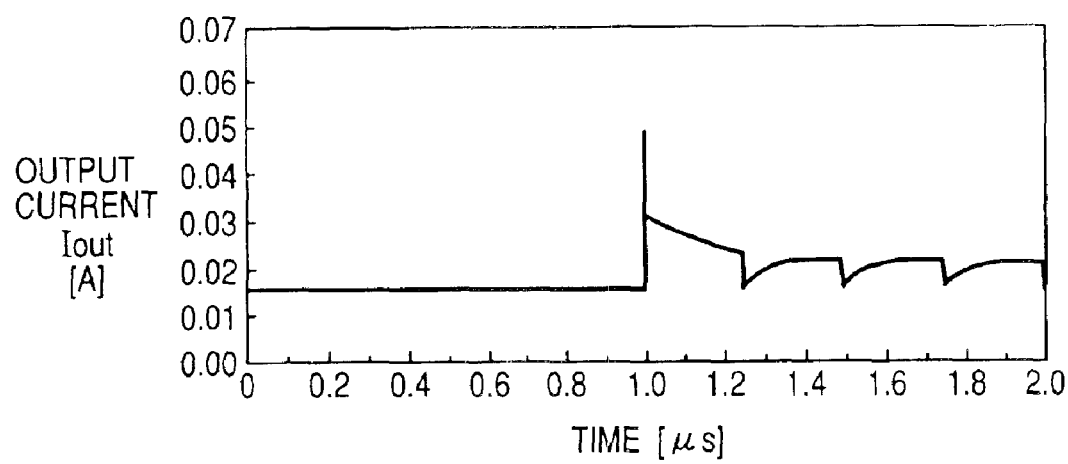
FIG. 2A is a graph showing a simulation waveform of an output current of the operational amplifier having a voltage follower connection when the non-reverse input voltage of 3.3 V is applied on the non-reverse input terminal of the operational amplifier and if the output terminal is short-circuited to the power line thereof.
Figure 2B:
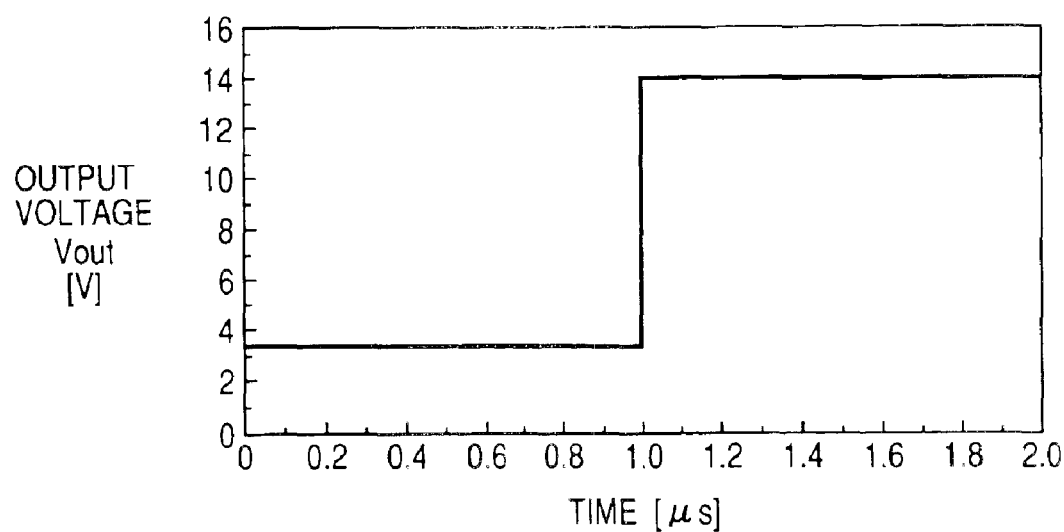
FIG. 2B is a graph showing a simulation waveform of an output voltage of the operational amplifier having the voltage follower connection when the non-reverse input voltage of 3.3 V is applied on the non-reverse input terminal and if the output terminal is short-circuited to the power line.
Figure 3:
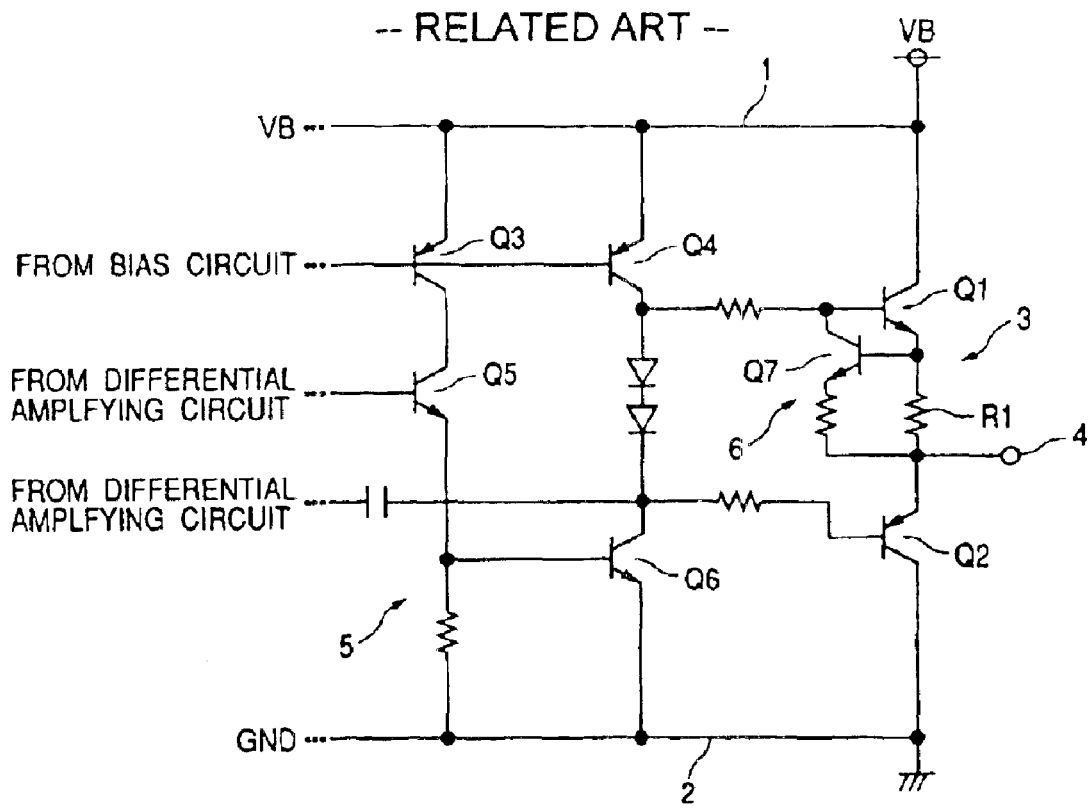
FIG. 3 is a view showing an electrical structure of a driving unit and an output unit of a conventional operational amplifier.

FIGS. 2A and 2B shows simulation waveforms of the output current Iout and the output voltage Vout of the operational amplifier 11 having the voltage follower connection when the non-reverse input voltage Vinp of 3.3 V is applied on the non-reverse input terminal 21 and if the output terminal 24 is short-circuited to the power line 12.

In each of FIGS. 2A and 2B, the horizontal axis represents elapsed time ($\mu$s) and the vertical axis represents the output current Iout (A) and the output voltage Vout (V).

When the output terminal 24 is short-circuited to the power line 12 whose voltage VB is 14V at the time of 1.0 $\mu$s, as shown in FIG. 2A, the output current Iout, as the short-circuit current, flows for a given short time, but after that, the output current Iout is regulated. In this case, the control signal reducing circuit 23 reduces the base current of the transistor Q27 within the range that the transistor Q27 is not turned off, in other words, is kept to on state, so that the transistor Q30 is not completely turned off, allowing the output current Iout to continuously flow while preventing excessive current from flowing in the transistor Q30.

When the short-circuit state between the output terminal 24 and the power line 12 is cancelled, the output voltage Vout of the output terminal 24 reduces so that the Zener diode D13 and the transistor Q28 turn off, respectively. The off-states of the Zener diode D13 and the transistor Q28 make immediately return the base current flowing through the transistors C26 into the transistor Q27 to the original base current before the short-circuit of the output terminal 24, allowing the transistor Q30 to recover the original driving capability. As a result, it is possible to make the operational amplifier 11 come back to the normal operation without making shift the operational amplifier 11 into an unstable condition.

In contrast, differently to the above embodiment of the invention, assuming that when the output terminal 24 is short-circuited so that the transistor Q27 is turned off and the transistor Q30 is completely turned off, when the short-circuit state of the output terminal 24 is cancelled, the control signal from the differential amplifying circuit 14 does not immediately act on the transistor Q27. As a result, the recovery of the driving capability of transistor Q27 and that of the current outputting capability of transistor Q30 are delayed so that the output state of the operational amplifier 11 may be unstable.

As described above, the operational amplifier 11 according to the embodiment has the feature of the control signal reducing circuit 23 in the driving circuit 15 so that, when the signal harness connected to the output terminal 24 is short-circuited to the power harness having the battery potential (voltage) VB and the voltage exceeding the voltage Vr is applied on the driving transistor Q27, the control signal reducing circuit 23 reduces the base current of the transistor Q27. The reduce of the base current of the transistor Q27 allows the driving capability of the transistor Q30 based on the transistor Q27 to temporally decrease, making it possible to regulate the short-circuit current flowing in the output transistor Q30.

The control signal reducing circuit 23 has no elements connected to the transistor Q30 in series, allowing the output voltage Vout to reduce to the vicinity of the ground voltage (0V), making it possible to widely set the output voltage range of the operational amplifier 11. The transistor Q27 is not short-circuited for a period that the output terminal 24 is short-circuited to the power harness so that the control signal related to the feedback and outputted from the differential amplifying circuit 14 is continuously inputted as the base current to the transistor Q27. As a result, when the short-circuit state of the output terminal 24 to the power harness is cancelled, the transistor Q27 immediately can recover the original driving capability of driving the transistor Q30 before the short-circuit of the output terminal 24 on the basis of the base current supplied to the transistor Q27 from the differential amplifying circuit 14 through the transistor Q26, allowing the operational amplifier 11 to come back to the normal operation without making shift the operational amplifier 11 into an unstable condition.

In addition, the voltage detecting circuit 22 regulates that the voltage applied on the transistor Q27 does not exceed the voltage Vr for the period that the output terminal 24 is short-circuited to the power harness, preventing an excessive voltage exceeding the voltage Vr from being applied on the collector-emitter of the transistor Q27. Furthermore, the resistor R23 connected between the collector of the transistor Q27 and the base of the transistor Q30 can regulate the current flowing through the transistor Q30 into the transistor Q27 and the Zener diode D13, making it possible to protect the transistor Q30 of the operational amplifier 11 from the excessive current.

The operational amplifier 11 installed in the ECU can be protected even if the output terminal is short-circuited so that, in cases where the operational amplifier 11 is installed in each ECUs, it is possible to wire the signal harnesses and the power harnesses together with each other between each of the ECUs or each ECU and other each in-vehicle components, thereby improving efficiency of wiring the harnesses and obtaining the guard ring effect of the signal harnesses.

Figure 4:
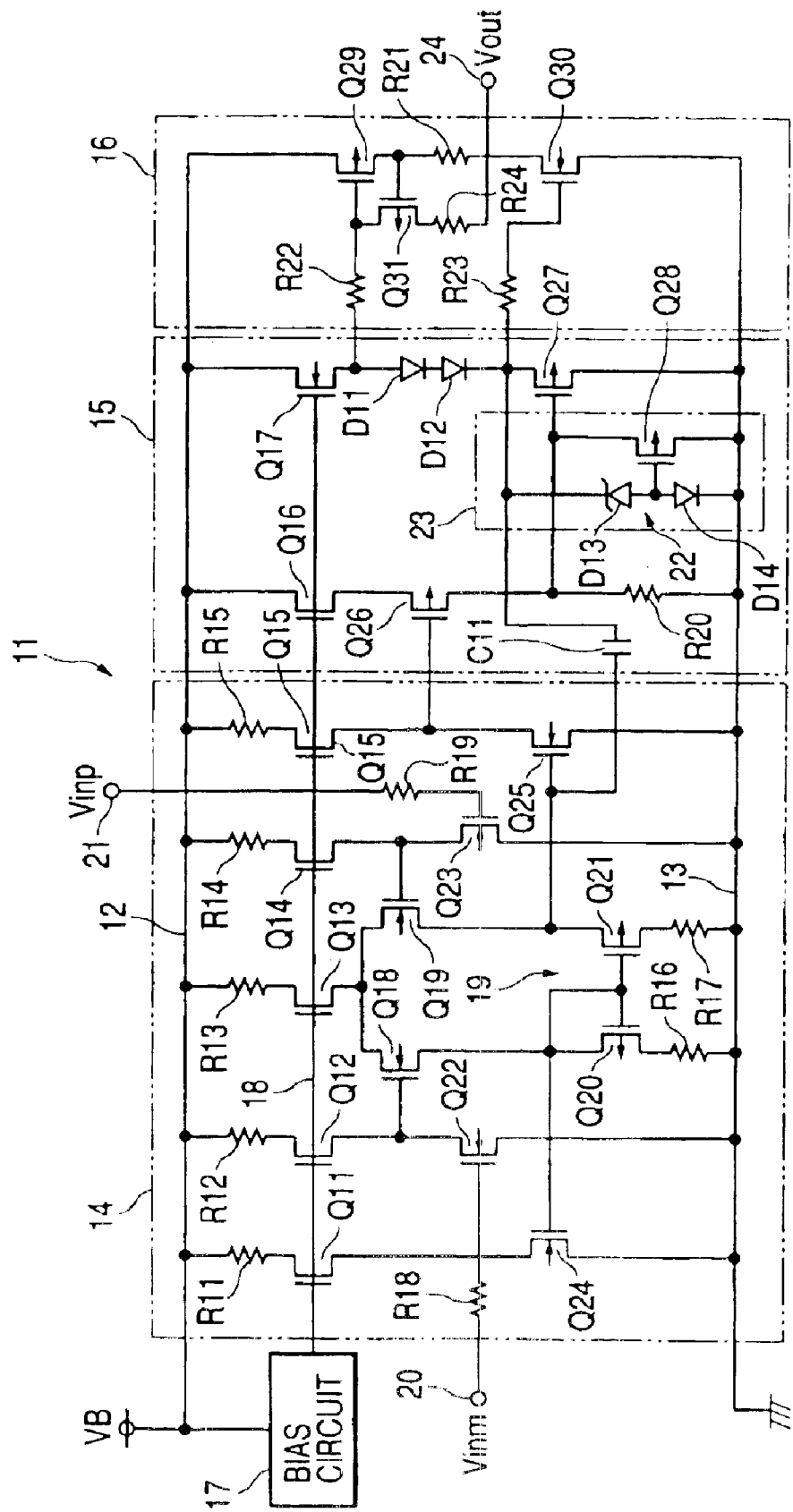
FIG. 4 is an electrical diagram showing the use of Field Effect Transistors (FETs) in place of the bipolar transistors in the circuit shown in FIG. 1, according to an embodiment of the invention.

Incidentally, in place of the bipolar transistors Q11–Q31 in FIG. 1, FETs Q11–Q31 (Field Effect Transistors) may be used, for example as shown in FIG. 4. In this case, the base, emitter and collector of each of the bipolar transistors are changed into the gate, source and drain of each of the FETs. In addition, in this case, the control signal supplied from the differential amplifying circuit to the driving FET corresponding to the transistor Q27 is referred to as gate control signal, and the control signal regulating circuit corresponding to the circuit 23 bears a part of the voltage supplied from the differential amplifying circuit for a period that the signal harness corrected to the output terminal 24 is short-circuited to the power harness, thereby reducing the gate voltage signal corresponding to the control signal applied on the driving FET.

Moreover, the control signal reducing circuit 23 according to the embodiment can protect the output transistor Q30 when the output terminal 24 is short-circuited to the power line 12 or the power harness, but the present invention is not limited to the structure.

That is, in FIG. 1, the power line 12 may be set to the ground voltage and the power line 13 may be set to the battery voltage, each type (PNP type or NPN type) of each transistors may be changed and the rectification direction of the diodes may be changed according to the types of the transistors.

As one example of the changes of types of transistors, the NPN transistor Q27 may be changed into the PNP transistor Q27'.

According to the modification, when the output terminal 24 is short-circuited to the ground line, it is possible to protect the output transistor Q30', which is the NPN transistor, of the operational amplifier 11'.

While there has been described what is at present considered to be the embodiment and modifications of the invention, it will be understood that various modifications which are not described yet may be made therein, and it is intended to cover in the appended claims all such modifications as fall within the true spirit and scope of the invention.

This application is based upon and claims the benefit of priority of the prior Japanese Patent Application 2002-227444 filed on Aug. 5, 2002 so that the contents of which are incorporated herein by reference.

What is claimed is:

1. An operational amplifier with an input terminal and an output terminal, said operational amplifier comprising:
    a differential amplifying circuit configured to amplify an input voltage inputted from the input terminal;
    an outputting transistor connected to the output terminal;
    a driving transistor connected to the differential amplifying circuit and the outputting transistor, said driving transistor turning to an on state based on a control signal to drive the outputting transistor so that a voltage of the output terminal is applied to the driving transistor through the outputting transistor; and
    a control signal reducing circuit, when the voltage of the output terminal applied to the driving transistor through the outputting transistor exceeds a predetermined threshold voltage, configured to reduce the control signal within a range that the driving transistor is kept to the on state.

2. The operational amplifier according to claim 1, wherein said driving transistor has control terminals and an output terminal, and said control signal reducing circuit comprises:
    a voltage detecting circuit connected to the driving transistor and configured to output a detection signal when the voltage applied on the driving transistor exceeds the threshold voltage; and
    a control signal regulating circuit connected between the control terminals of the driving transistor, said control signal regulating circuit being configured to, when the voltage detecting circuit outputs the detection signal, negate a part of the control signal supplied from the differential amplifying circuit.

3. The operational amplifier according to claim 2, wherein said voltage detecting circuit is configured to regulate the voltage applied on the driving transistor so that the applied voltage does not exceed the threshold voltage.

4. The operational amplifier according to claim 2, wherein said control signal regulating circuit is configured to relieve a part of the control signal to a ground of the operational amplifier according to the detection signal, said control signal being supplied from the differential amplifying circuit.

5. The operational amplifier according to claim 2, wherein said outputting transistor has a first terminal, a second terminal and a third terminal, said first terminal is connected to the output terminal, and further comprising a current regulating circuit connected between the output terminal of the driving transistor and the second terminal of the outputting transistor.

6. The operational amplifier according to claim 5, wherein said voltage detecting circuit comprises a Zener diode and a diode, an anode of said Zener diode and that of said diode being commonly connected to each other, a cathode of said Zener diode being connected to the output terminal of the driving transistor, a cathode of sail diode being connected to one of the control terminals of the driving transistor, and wherein said control signal regulating circuit includes a transistor having a first terminal, a second terminal and a third terminal, said first terminal of the transistor being connected to the commonly connected point between the anodes of the Zener diode and the diode, said second terminal being connected to one of the control terminals of the driving transistor, said third terminal being connected to other of the control terminals of the driving transistor.

7. The operational amplifier according to claim 1, wherein said outputting transistor and the driving transistor are bipolar transistors, respectively.

8. The operational amplifier according to claim 1, wherein said outputting transistor and the driving transistor are field effect transistors, respectively.

* * * * *